United States Patent
Mitros et al.

(10) Patent No.: US 7,166,903 B2
(45) Date of Patent: Jan. 23, 2007

(54) DRAIN EXTENDED MOS TRANSISTORS WITH MULTIPLE CAPACITORS AND METHODS OF FABRICATION

(75) Inventors: Jozef Mitros, Richardson, TX (US); Ralph Oberhuber, Kumhausen (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/400,464

(22) Filed: Apr. 7, 2006

(65) Prior Publication Data

US 2006/0175678 A1  Aug. 10, 2006

Related U.S. Application Data

(62) Division of application No. 11/047,245, filed on Jan. 31, 2005.

(51) Int. Cl.
*H01L 27/108* (2006.01)
*H01L 29/76* (2006.01)
*H01L 29/94* (2006.01)
*H01L 31/119* (2006.01)
*H01L 29/00* (2006.01)

(52) U.S. Cl. .................................. 257/532; 257/296
(58) Field of Classification Search ........ 257/295–310, 257/530–535
See application file for complete search history.

(56) References Cited

U.S. PATENT DOCUMENTS

| | | | |
|---|---|---|---|
| 5,296,393 A | 3/1994 | Smayling et al. | |
| 5,604,369 A | 2/1997 | Duvvury et al. | |
| 5,729,035 A | 3/1998 | Anma | |
| 5,981,335 A | 11/1999 | Chi | |
| 6,300,662 B1 | 10/2001 | Doyle et al. | |
| 6,445,617 B1 | 9/2002 | Sakakibara | |
| 6,528,842 B1 | 3/2003 | Luich et al. | |
| 6,548,874 B1 | 4/2003 | Morton et al. | |
| 6,660,603 B2 | 12/2003 | Mitros | |
| 6,730,960 B2 | 5/2004 | Forbes | |
| 6,804,095 B2 | 10/2004 | Kunz et al. | |
| 2001/0032997 A1 | 10/2001 | Forbes et al. | |
| 2002/0043676 A1 | 4/2002 | Ohtsuka et al. | |
| 2005/0285218 A1 * | 12/2005 | Wu et al. | 257/500 |

FOREIGN PATENT DOCUMENTS

EP  0847091  10/1998

* cited by examiner

*Primary Examiner*—Cuong Nguyen
(74) *Attorney, Agent, or Firm*—Rose Alyssa Keagy; W. James Brady; Frederick J. Telecky, Jr.

(57) ABSTRACT

Multi-capacitor drain extended transistor devices and methods are provided. A first capacitor structure comprises a first dielectric layer (14) and a first gate layer (16) and first and second lateral sides. The first capacitor structure overlies a channel region of a first conductivity type in a semiconductor substrate (4). A second capacitor structure comprising a second dielectric layer (26) and a second gate layer (28) is formed overlying the first gate structure. A source region (22) of a second conductivity type formed in the semiconductor substrate (6) proximate the first lateral side of the gate and a drain extension region/well (12) lightly doped of the second conductivity type is formed in the semiconductor substrate under a portion of the gate structure. A drain region (24) of the second conductivity type formed within the drain extension region (12). The first capacitor structure and the second capacitor structure connect in series to permit a higher operational gate voltage. Other systems and methods are disclosed.

5 Claims, 6 Drawing Sheets

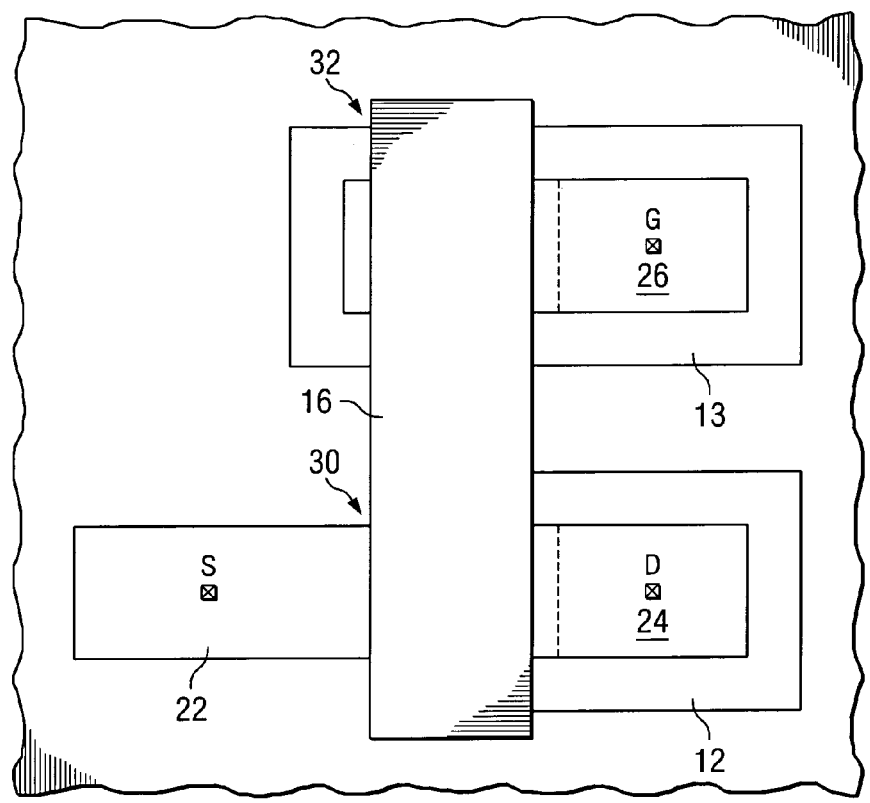
FIG. 2B
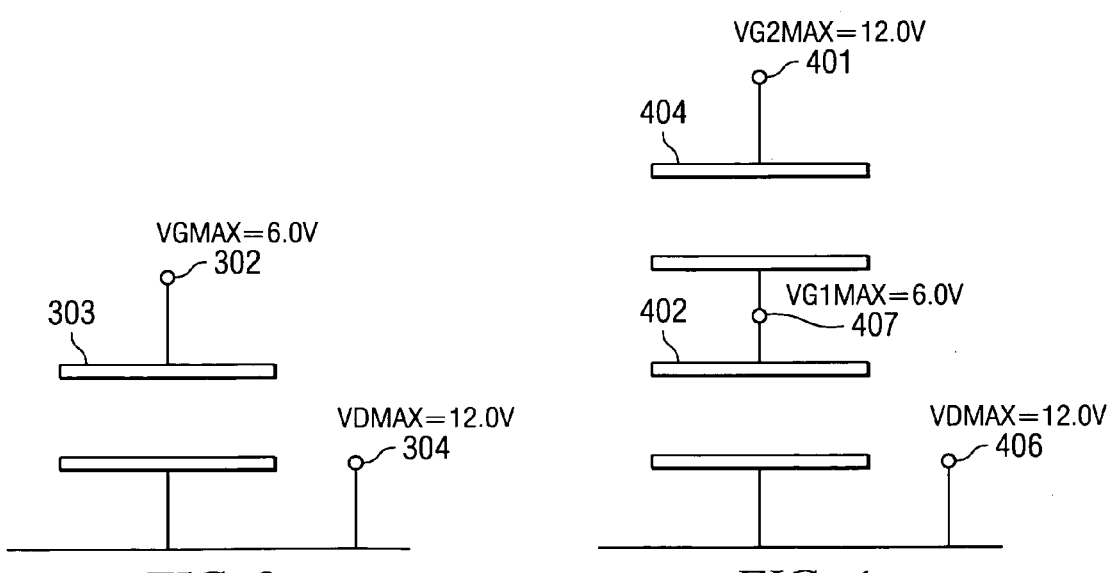
FIG. 3
FIG. 4

US 7,166,903 B2

DRAIN EXTENDED MOS TRANSISTORS WITH MULTIPLE CAPACITORS AND METHODS OF FABRICATION

This is a division of application Ser. No. 11/047,245, filed Jan. 31, 2005.

FIELD OF INVENTION

The present invention relates generally to semiconductor devices and more particularly to improved drain extended MOS transistors and fabrication methods thereof.

BACKGROUND OF THE INVENTION

Many integrated circuit devices include digital circuitry formed of metal-oxide-semiconductor (MOS) transistor devices, which are built using complementary MOS (CMOS) fabrication processes optimized for high-density, high-speed N-channel and P-channel MOS transistors. Such high-density circuitry is common in modern consumer electronic products such as wireless communications devices, portable computers, etc., in which digital circuitry is powered by batteries. In such products, it is desirable to provide a maximum amount of functionality in a limited amount of space, while keeping power consumption and cost to a minimum. To optimize circuit functionality, area, and power consumption, transistor sizes are often minimized and the transistors are designed to operate at low voltage levels. In addition, the use of simple fabrication processes aids in keeping product manufacturing costs to a minimum, wherein it is desirable to fabricate both low voltage and higher voltage transistors in an integrated circuit (IC) using a single streamlined fabrication process flow.

In fabricating integrated circuits for such battery powered products, a certain number of transistors are needed for switching power from the battery. These power transistors may need to withstand higher voltages than do the logic transistors of the IC. For example, logic transistors may be operated at voltages of about 1.8 volts or less, whereas battery power transistors may be used to switch power from batteries at 6 volts or higher. Such power switching circuits are often fabricated using N or P channel drain-extended metal-oxide-semiconductor (DEMOS) transistor devices, such as lateral diffused MOS (LDMOS) devices or REduced SURface Field (RESURF) transistors. DEMOS devices advantageously combine short-channel operation with high current handling capabilities, relatively low drain-to-source on-state resistance (Rdson), and the ability to withstand relatively high drain-to-source voltages without suffering voltage breakdown failure, where DEMOS device designs often involve a tradeoff between breakdown voltage (BVdss) and Rdson. In addition to performance advantages, DEMOS device fabrication is relatively easy to integrate into CMOS process flows, facilitating use in devices where logic, low power analog, or other circuitry is also to be fabricated in a single integrated circuit (IC).

Fabrication of semiconductor products/devices typically involves a large number of processing steps, many of which employ masks for selectively operating on specific portions of a semiconductor wafer. Manufacturing cost for integrated circuits is a function of the number of processing steps in a given process flow, wherein reducing the number of masks and processing steps reduces the manufacturing cost.

Generally, operating gate voltages vary along with a transistor's intended function. Power transistors typically require higher operational gate voltages and drain-source voltages whereas logic transistors prefer lower gate voltages and drain-source voltages. Higher operational gate voltages can be obtained by increasing the thickness of the gate dielectric. However, this increased thickness slows the operational speed of these devices, which for logic transistors may be unsatisfactory.

What is needed are semiconductor devices and methods of fabrication that provide DEMOS devices with varied operation voltages yet require only a limited number of fabrication processing steps.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention relates to improved drain extended transistors and fabrication methods thereof. Multiple capacitors are employed per transistor to allow selection of different operational gate voltages and permit use of relatively high operational gate voltages. The multiple capacitors are connected in series, which allows their individual dielectric thicknesses to be combined, thereby permitting higher operational gate voltages. As a result, the same voltage levels employed for programming and erasing and applied to drains can also be employed and applied to gates using the multiple capacitors connected in series.

In accordance with one aspect of the invention, a first capacitor structure comprises a first dielectric layer and a first gate layer and first and second lateral sides. The first capacitor structure overlies a channel region of a first conductivity type in a semiconductor substrate. A second capacitor structure comprising a second dielectric layer and a second gate layer is formed overlying the first gate structure. A source region of a second conductivity type formed in the semiconductor substrate proximate the first lateral side of the gate and a drain extension region/well lightly doped of the second conductivity type is formed in the semiconductor substrate under a portion of the gate structure. A drain region of the second conductivity type is formed within the drain extension region.

One aspect of the invention provides a drain extended MOS (DEMOS) transistor, comprising a gate overlying a channel region of a first conductivity type in a semiconductor body, a source of a second conductivity type formed along a first side of the channel, a well of the second conductivity type that extends under a portion of the gate from a second side of the channel to beyond the gate, and a drain of the second conductivity type formed in the well, where the drain is spaced from the side of the gate. The DEMOS transistor further comprises a voltage drop region in the well extending between a first end proximate the gate to a second end, where the voltage drop region has fewer dopants of the second conductivity type than the well. In another aspect of the invention, the voltage drop region is laterally spaced from the drain, wherein the voltage drop region has more dopants of the first conductivity type than the well. Other systems and methods are disclosed.

The following description and annexed drawings set forth in detail certain illustrative aspects and implementations of

BRIEF DESCRIPTION OF THE DRAWINGS

FIG. 2B is a layout view of a multi-capacitor drain extended transistor device in accordance with an aspect of the present invention.

FIG. 3 is a diagram illustrating properties of a conventional drain extended transistor device.

FIG. 4 is a diagram illustrating electrical properties of a multi-capacitor drain extended transistor device in accordance with an aspect of the present invention.

DETAILED DESCRIPTION OF THE INVENTION

Figure 1A:
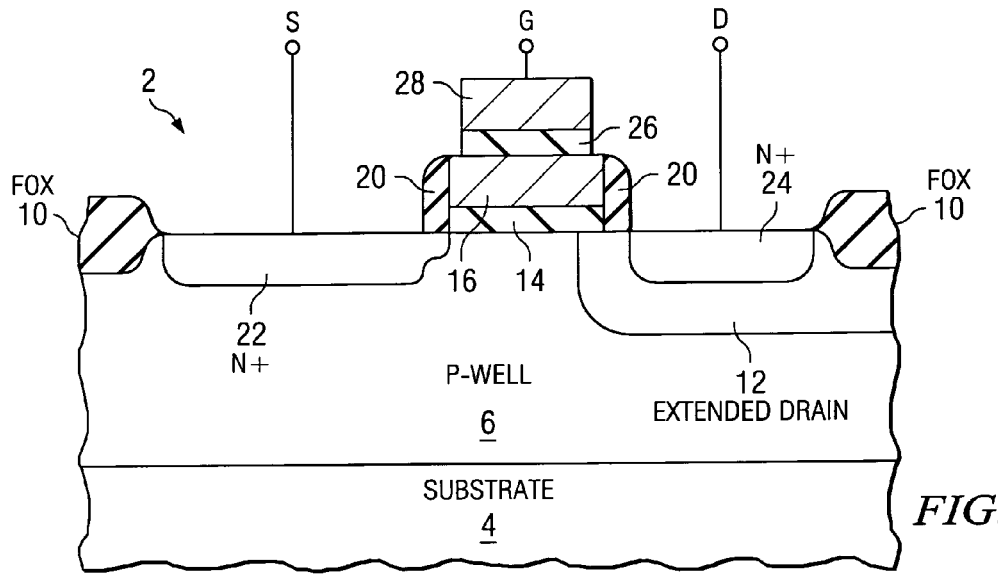
FIG. 1A is a cross section of a multi-capacitor drain extended transistor device in accordance with an aspect of the present invention.

One or more implementations of the present invention will now be described with reference to the attached drawings, wherein like reference numerals are used to refer to like elements throughout, and wherein the illustrated structures are not necessarily drawn to scale.

The invention provides drain extended MOS (DEMOS) transistors and fabrication techniques by that permit selection and use of larger operational gate voltages. The invention employs multiple capacitors per transistor device instead of a single capacitor per device as is conventionally used.

DEMOS transistors generally allow for drain to source operational voltages significantly higher than other MOS transistors. Typically, the drain to source voltages for DEMOS transistors are also substantially higher than gate operational voltages. For example, a DEMOS transistor formed with a 75 Angstrom gate oxide may have a maximum operational gate voltage, Vgs max, of 3.6 V, but has a maximum operational drain to source voltage, Vds max, of 15 V.

A number of mechanisms can be employed to account for varied operational voltages on a single die. One mechanism is to form transistor devices with varying dielectric thicknesses. The thicker dielectric based transistors can then employ higher operational gate voltages and thinner dielectric based transistors employ lower operational gate voltages, but operate at faster speeds. To form these devices, regions may be masked while devices with one thickness are formed, and then the formed devices are masked. The previously masked regions are then unmasked and DEMOS devices with other dielectric thickness are formed therein.

Another mechanism is to form all of the transistors with relatively thin dielectrics and use level shifters to reduce applied operational voltages for selected devices (e.g., power transistors). Unfortunately, substantial increased complexity and substantial increased area use can result due to the use of the level shifters.

Yet another mechanism employed is to form all of the transistors with relatively thick dielectrics that can accommodate higher operation voltages. However, the increased dielectric thickness limits the operational speed of the transistors present on the device.

Some semiconductor devices, such as single poly EEPROM arrays, include periphery regions that require using DEMOS transistors because available voltages for programming and erasing are 13 V. In this example, level shifters must be employed to ensure that Vgs does not exceed the allowed maximum voltage permitted by the gate dielectric employed, referred to as Vox max. The level shifters complicate the circuit design, require design know-how to implement, increase design time, and the like. As a result, use of such semiconductor devices (e.g., single poly EEPROMs) can be discouraged.

Figure 1B:
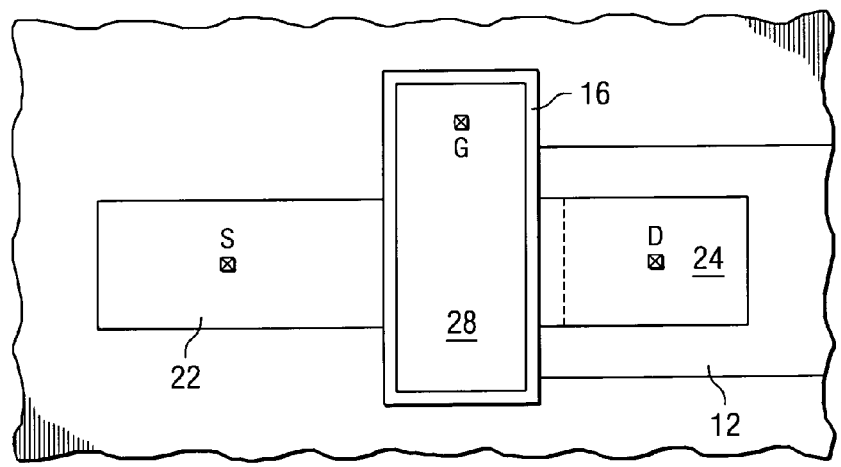
FIG. 1B is a layout view of a multi-capacitor drain extended transistor device in accordance with an aspect of the present invention.

FIGS. 1A and 1B depict a multi-capacitor DEMOS transistor device 2 in accordance with an aspect of the present invention. The device 2 has a first capacitor and a second capacitor in series with the first capacitor. The first capacitor can be employed for a lower gate voltage, higher speed operation or the second capacitor can be employed for a higher gate voltage, lower speed operation. The device 2 is illustrated as an NMOS device to more clearly illustrate the present invention, however it is appreciated that the present invention includes PMOS devices.

FIG. 1A is a cross section of a multi-capacitor drain extended transistor device 2 in accordance with an aspect of the present invention. Isolation regions 10 are formed on a semiconductor substrate or body 4 and a p-well 6 is formed within the semiconductor substrate 4. The isolations regions 10 can be local oxidation structures (LOCOS), shallow trench isolation regions (STI), or another suitable integrated circuit isolation scheme. The p-well 6 can be formed by implanting a p-type dopant, such as Boron, with a relatively low concentration and dose and a relatively high energy. Alternately, the p-well 6 can be formed by selecting the semiconductor substrate 4 such that it comprises p-type doping of a sufficient concentration. The semiconductor substrate 4 is comprised of a semiconductor material, such as silicon or silicon-germanium, and may be doped or un-doped.

A drain extension region 12 is formed within the p-well that increases the drain to source operational voltage and provides the properties of DEMOS transistors. The drain extension region 12 is formed by implanting n-type dopants, such as phosphorous, with relatively low energy and dose to form the region as begin relatively shallow and lightly doped.

A source region 22 is formed within the p-well and a drain region 24 is formed within the drain extension region 12, also defining a channel region there between. The source region 22 and the drain region 24 are formed by implanting n-type dopants with a higher dose and lower energy than that employed in forming the drain extension region 12.

A first gate dielectric layer 14 is formed on the substrate 4 around the channel region and a first gate layer 16 is formed on the first gate dielectric layer 14. The first gate dielectric layer 14 has a first equivalent oxide thickness (e.g., 75 Angstrom) that at least partly defines a maximum first gate voltage that can be employed for the transistor device 2. The first gate layer 16 is comprised of a conductive material, such as polysilicon, doped or undoped. The first gate layer 16, the first gate dielectric layer 14, and portion of the channel region there under form and define a first capacitor structure, wherein the first gate layer 16 is a top plate, the first gate dielectric 14 is a dielectric layer, and a portion of the channel region acts as a bottom plate. Sidewall spacers 20 are formed on lateral edges of the gate layers by, for example, depositing an insulative spacer material, such as oxide, and anisotropically etching the deposited later thereby forming the spacers 20.

A second gate dielectric layer 26 is formed on the first gate layer 16 and a second gate layer 28 is formed on the second gate dielectric layer 26. The second gate dielectric layer 26 has a second equivalent oxide thickness (e.g., 300 Angstrom) that at least partly defines a maximum second gate voltage that can be employed for the transistor device 2. The second gate layer 28 is also comprised of a conductive material, such as titanium-nitride (TiN), polysilicon, and the like. The second gate layer 28, the second dielectric layer 26, and the first gate layer 16 define a second capacitor structure wherein the first gate layer 16 is a bottom plate, the second dielectric layer 26 is a dielectric, and the second gate layer 28 is a top plate.

For lower voltage, higher speed operation, programming and/or erase voltages can be applied to the first gate layer 16. For higher voltage, lower speed operation, programming and/or erase voltages can be applied to the second gate layer 28. This selection can be obtained in a number of acceptable ways. One mechanism is to simply form contacts to one gate layer or the other during contact formation. Thus, different transistors can be used with different operational voltages while permitting formation of all the devices in substantially similar manners or without additional processing steps. Another mechanism is for form contacts to each gate layer and employ logic that permits selection of the gate layer after fabrication has been completed. The logic can then be controlled to employ whichever gate layer for particular transistors during operation. For example, the logic could dynamically select a contact to the second gate layer 28 for low speed operation and employ a contact to the first gate layer 16 for high speed operation. Yet another mechanism is to form contacts to each gate layer and employ fuses that permit selection of the gate layer to be used.

FIG. 1B is a layout view of a multi-capacitor drain extended transistor device in accordance with an aspect of the present invention. The layout is merely exemplary in nature and is provided to further illustrate the present invention. It is appreciated that other layouts are possible in accordance with the present invention.

A gate contact is shown connected to the second gate layer 28. The first gate layer 16 is shown below the second gate layer 28. The drain region 24 is shown formed within the drain extension region 12. Note that the spacers 20 are not shown in FIG. 1B in order to facilitate a better understanding of the present invention.

Figure 2A:
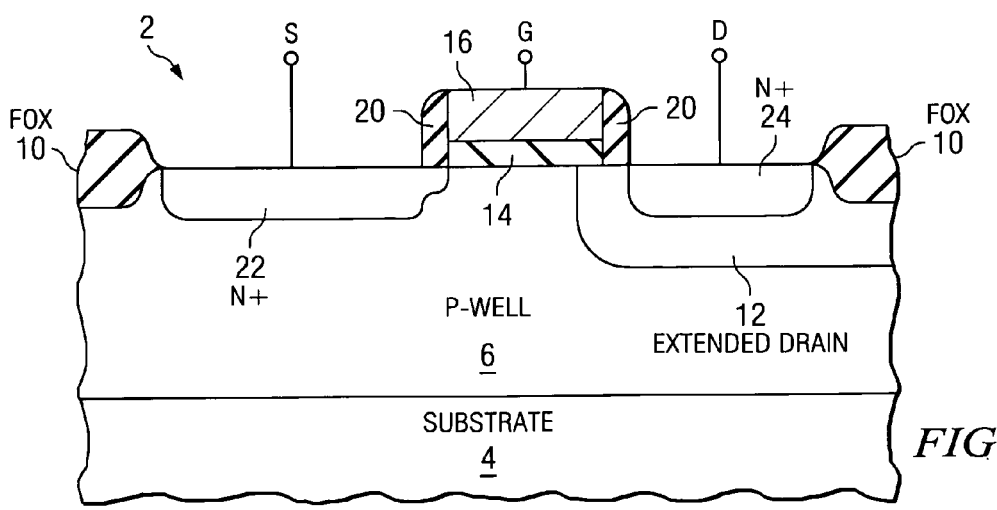
FIG. 2A is a cross section of a multi-capacitor drain extended transistor device in accordance with an aspect of the present invention.

FIGS. 2A and 2B depict another multi-capacitor drain extended transistor device 2 in accordance with an aspect of the present invention. The device 2 has a first capacitor and a second capacitor in series with the first capacitor. The first capacitor can be employed for lower gate voltage, higher speed operation or the second capacitor can be employed for higher gate voltage, lower speed operation. However, unlike the device illustrated in FIGS. 1A and 1B, which has the first and second capacitors in a stack, the device of FIGS. 2A and 2B uses a single gate layer with another well region to obtain the two capacitors. The device 2 is illustrated as an NMOS device to more clearly illustrate the present invention, however it is appreciated that the present invention includes PMOS devices.

FIG. 2A is a cross section of a multi-capacitor drain extended transistor device 2 in accordance with an aspect of the present invention. Isolation regions 10 are formed on a semiconductor substrate or body 4 and a p-well 6 is formed within the semiconductor substrate 4. The isolations regions 10 can be local oxidation structures (LOCOS), shallow trench isolation regions (STI), or another suitable integrated circuit isolation scheme. The p-well 6 can be formed by implanting a p-type dopant, such as Boron, with a relatively low concentration and dose and a relatively high energy. The semiconductor substrate 4 is comprised of a semiconductor material, such as silicon or silicon-germanium, and may be doped or un-doped.

Drain extension regions 12 and 13 (shown in FIG. 2B) are formed within the p-well 6 that increases the drain to source operational voltage and provides the properties of DEMOS transistors. The drain extension regions 12 and 13 are formed by implanting n-type dopants, such as phosphorous, with relatively low energy and dose to form the region as being relatively shallow and lightly doped. A source region 22 is formed within the p-well and a drain region 24 is formed within the drain extension region 22 also defining a channel region there between. The source region 22 and the drain region 24 are formed by implanting n-type dopants with a higher dose and lower energy than that employed in forming the drain extension region 22. Another n-type region 26 (shown in FIG. 2B) is formed within the drain extension region 13 in a similar manner.

A gate dielectric layer 14 is formed on the substrate 4 over the channel region and extending through the drain extension region 13 near the n-type region 26. A gate layer 16 is then formed on the gate dielectric layer 14. The gate dielectric layer 14 has an equivalent oxide thickness (e.g., 75 Angstrom) that at least partly defines a maximum first gate voltage that can be employed for the transistor device 2. The gate layer 16 is comprised of a conductive material, such as polysilicon, doped or undoped. The gate layer 16, the gate dielectric layer 14, and portion of the channel region there under form and define a first capacitor, wherein the gate layer 26 is a top plate, the gate dielectric 24 is a dielectric layer, and the portion of the channel region is a bottom plate.

A second capacitor is defined by the gate layer 16 and the dielectric layer 14 on the drain extension region 13, wherein the gate layer 16 is a bottom plate, the dielectric layer 14 is a dielectric, and underlying silicon within region 13 is the top plate. Sidewall spacers 20 (not shown in FIG. 2B) are formed on lateral edges of the gate layers by, for example, depositing an insulative spacer material, such as oxide, and anisotropically etching the deposited later thereby forming the spacers 20.

FIG. 2B is a layout view of a multi-capacitor drain extended transistor device in accordance with an aspect of the present invention. The layout is merely exemplary in nature and is provided to further illustrate the present invention. It is appreciated that other layouts are possible in accordance with the present invention.

A gate contact is shown formed on the n-type region 26. The first capacitor is shown at 30 and the second capacitor is shown at 32. Here, the max operational gate voltage is a function of twice the equivalent oxide thickness of the dielectric layer 14. The gate contact could also be formed on or in contact with the gate layer 16.

For lower voltage, higher speed operation, programming and/or erase voltages can be applied to the gate layer 16 at the first capacitor 30. For higher voltage, lower speed operation, programming and/or erase voltages can be applied to the n-type region 26, which connects the first capacitor 30 and the second capacitor 32 in series. This selection can be obtained in a number of acceptable ways. One mechanism is to simply form contacts to one gate layer or the other during contact formation. Thus, different transistors can be used with different operational voltages while permitting formation of all the devices in substantially similar manners or without additional processing steps. Another mechanism is to form contacts to each gate layer and employ logic that permits selection of the gate layer after fabrication has been completed. The logic can then be controlled to employ whichever gate layer for particular transistors during operation. For example, the logic could dynamically select a contact to the n-type region 26 for low speed operation and employ a contact to the gate layer 16 for high speed operation. Yet another mechanism is to form contacts to each gate layer and employ fuses that permit selection of the capacitors 30 and 32 to be employed.

FIG. 3 is a diagram illustrating properties of a conventional drain extended transistor device. The diagram shows only a gate 302 and drain 304 of the transistor device. Due to the presence of a lightly doped drain extension region adjacent to a drain 304 that depletes at high voltages, relatively high drain to source voltages can be employed for erasing and/or programming operations. As an example, a maximum drain to source voltage, Vd max, that can be applied to the drain 304 is 12.0 V.

The gate 302 has a single capacitor 303, which has a dielectric thickness or equivalent oxide thickness (e.g., 75 Angstroms). A maximum gate voltage, Vg max, that can be employed is a function of the equivalent oxide thickness and can only be increased by increasing the dielectric thickness of the single capacitor 303. Continuing with the above example, an exemplary Vg max for the single capacitor gate 302 is 6.0 V. Thus, there exists a relatively large discrepancy in voltages employed for programming and erasing with the gate 302 and the drain 304. For such a transistor, level shifter or the like are required to reduce a supply voltage from that suitable for the drain 304 to the gate 302.

FIG. 4 is a diagram illustrating electrical properties of a multi-capacitor drain extended transistor device in accordance with an aspect of the present invention. The drain extended transistor device includes a gate 401, which comprises a first capacitor 402 and a second capacitor 404, and a drain 406. It is appreciated that the present invention contemplates drain extended transistor devices that comprise more than two capacitors connected in series for their gates.

The drain 406 is formed within a lightly doped drain extension region that depletes at high voltages. As a result, as described above, relatively high drain to source voltages, Vd, can be employed for erasing and/or programming operations. As an example, a maximum drain to source voltage, Vd max that can be applied to the drain 304 is 12.0 V.

The gate 401 has the first capacitor 402 and the second capacitor 404 connected in series. The first capacitor 402 has a first equivalent oxide thickness (e.g., 75 Angstroms) and the second capacitor 404 has a second equivalent oxide thickness. A maximum gate voltage, Vg max, is a function of an equivalent oxide of a dielectric material for the gate. Generally, as the Vg max increases as a thickness of the equivalent oxide increases. The gate 401 has a total equivalent oxide thickness that is the sum of the first equivalent oxide thickness and the second equivalent oxide thickness. As a result, the Vg max for this device is higher than that of the conventional device depicted in FIG. 3, assuming the equivalent oxide thickness for the single capacitor is less than the total equivalent oxide thickness for the gate 401. Continuing with the above example, an exemplary Vg max for the two capacitor gate 401 is 12 V. Thus, the voltages employed for programming and erasing with the gate 401 and the drain 406 are substantially similar. For such a transistor, a supply voltage suitable for programming and erasing operations for the drain 406 is also suitable for the gate 401 without requiring level shifters. If higher speed operation is desired, a gate 407 using only the first capacitor can be employed, which limits Vg max but permits faster operation due to only the first equivalent oxide thickness coming into play.

Figure 5:
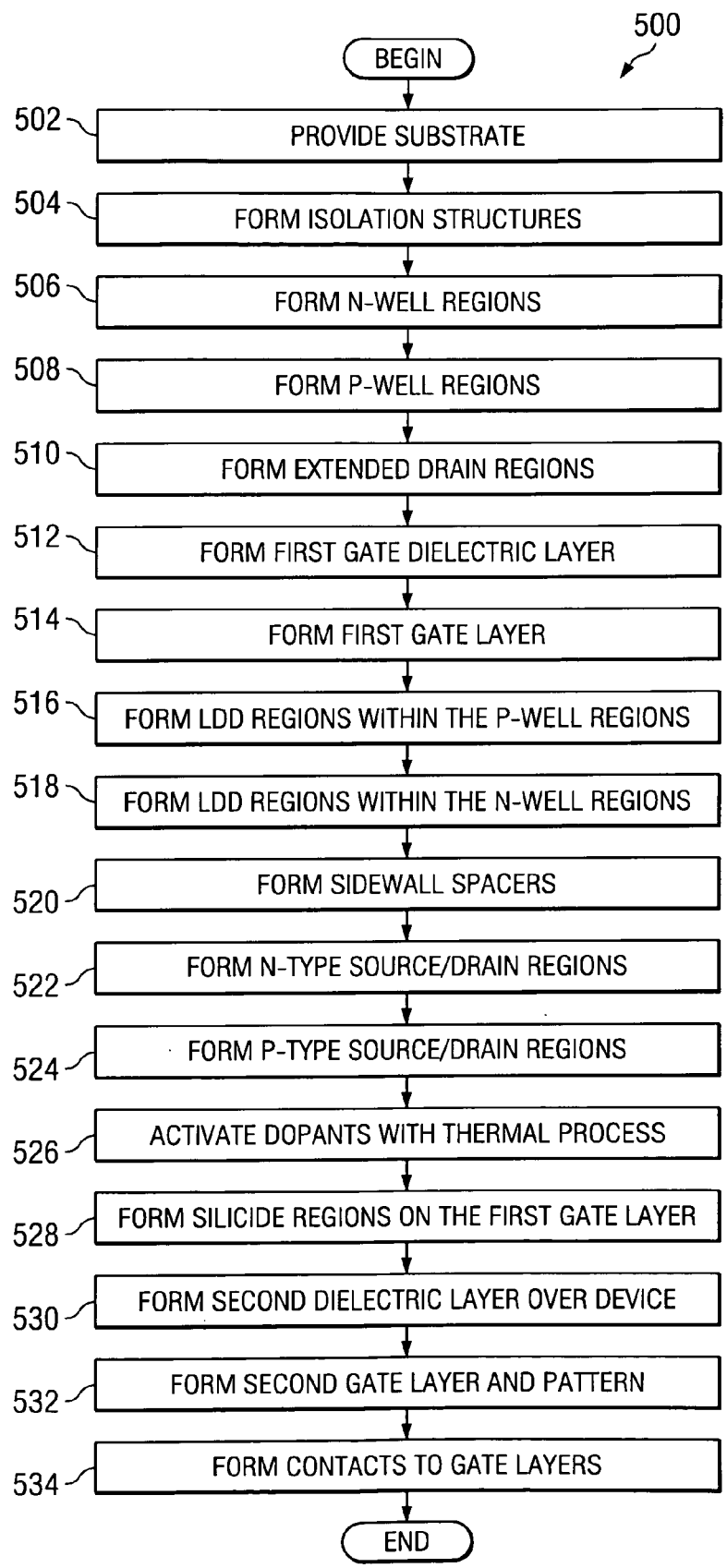
FIG. 5 is a flow diagram illustrating a method of fabricating a multi-capacitor drain extended transistor in accordance with an aspect of the present invention.

FIG. 5 is a flow diagram illustrating a method 500 of fabricating a multi-capacitor drain extended transistor in accordance with an aspect of the present invention. The method 500 forms a second capacitor on top of a first capacitor, thereby permitting a higher Vg max.

The method 500 begins at block 502, wherein a semiconductor substrate or body is provided. The semiconductor substrate is comprised of a semiconductor material such as silicon. The semiconductor substrate or body is typically a wafer and may be doped or undoped.

Isolation structures are formed on the substrate at block 504. The isolation structures serve to electrically isolate individual transistors on the device. The isolation structures can be local oxidation structures (LOCOS), shallow trench isolation regions (STI), or another suitable integrated circuit isolation scheme. LOCOS structures are formed by first depositing oxide and nitride films, which are then patterned and etched to expose areas in the substrate where the isolation structure is required. The substrate is then oxidized to form the isolation structures. STI structures are formed by first etching a trench in the substrate, which is then filled with an insulator comprised of an insulative material, such as, silicon oxide, silicon nitride, and the like.

N-well regions are formed for p-type devices and p-well regions are formed for n-type devices at block 506. Implanting n-type and p-type dopant species into the substrate forms the n-well and p-well regions, respectively.

N-type and p-type extended drain regions are formed at block 508. The extended drain regions are formed by implanting selected dopants with a relatively low dose and low energy. The n-type extended drain regions are formed within the p-well regions and doped with a dopant concentration substantially less than that of later formed source and drain regions and the dopant concentration is selected such that it will deplete when the drain voltage increases. Similarly, the p-type extended drain regions are formed within the n-well regions and doped with a dopant concentration substantially less than that of later formed source and drain regions and the dopant concentration is selected such that it will deplete when the drain voltage increases. It is noted that the present invention contemplates other variation of drain extended transistors, including transistors wherein the extended drain regions are as deep as the well regions.

Additionally, n-type and p-type threshold voltage implants are also typically performed at this time. The threshold voltage implants are for setting the transistor threshold voltages. Other implants, such as n-type and p-type punch through implants, n-type and p-type channel stop implants, n-type and p-type pocket implants may also be performed. The punch through implants are for reducing transistor off current. The channel stop implants are for reducing isolation leakage. The pocket implants are for reducing threshold voltage roll-off.

A first gate dielectric layer is formed over the device at block 510. The first gate dielectric layer is comprised of a dielectric material, such as oxide, thermally grown oxide, a nitride, an oxynitride, and the like. The first gate dielectric layer is formed with a suitable thickness (e.g., 75 Angstroms). It is noted that other conventional methods required forming dielectric layers with varying thicknesses in different regions to accommodate power and logic transistor devices.

A first gate layer is formed on the first gate dielectric layer at block 512. The first gate layer is formed on the first gate dielectric layer by depositing or forming a layer of conductive material. Some suitable conductive materials include, but are not limited to, polycrystalline silicon ("poly" or "polysilicon"), and the like. The first gate dielectric layer and the first gate layer are then patterned at block 514 to form first gate/capacitor structures, which also serve as alignment structures. The first gate/capacitor structures are generally positioned so as to overly both the well regions and later formed lightly doped drain regions.

Lightly doped n-type drain extension regions are formed within the p-well regions (NMOS) at block 516. Lightly doped p-type drain extension regions are formed within the n-well regions at block 518.

Sidewall spacers are formed on lateral edges of the gate structures at block 520. Sidewall spacer material, including silicon dioxide, silicon nitride, and the like, is blanket deposited and then etched anisotropically to form the sidewall spacers.

Source regions are formed within the p-well regions and drain regions are formed within the n-type lightly doped drain extension regions at block 522. N-type dopants, such as phosphorous or arsenic, are implanted using a mask and the gate structures as alignment structures. The drain region formed is more n-type than the surrounding lightly doped drain extension region.

Source regions are formed within the n-well regions and drain regions are formed within the p-type lightly doped drain extension regions at block 524. P-type dopants, such as Boron (B) and $BF_2$, are implanted using a mask and the gate structures as alignment structures. The drain region formed is more p-type than the surrounding lightly doped drain extension region.

A thermal process, such as a rapid thermal anneal or source/drain anneal is performed at block 526. The thermal process activates implanted dopants, particularly within the source/drain regions. Silicide regions are then formed on the first gate layer at block 528. The silicide regions can be comprised of cobalt (Co), titanium (Ti), and the like. Generally, the silicide regions are formed by applying a mask and sputtering a silicide material (e.g., Co, Ti, and the like) onto the first gate layer. A silicide process is then performed causing the silicide material to react with underlying material (e.g., silicon) thereby forming silicide regions. Additionally, a thermal process or anneal is typically performed. The silicide regions generally provide a lower contact resistance to the first gate layer.

A second dielectric layer is formed at block 530 over the device. A suitable process for forming the second dielectric layer is to employ tetraethoxysilane (TEOS), a precursor for $SiO_2$ formation by chemical vapor deposition until a suitable thickness is obtained. The thickness of this dielectric layer can vary according to desired Vg max (e.g., about 20 Angstroms to about 500 Angstroms).

A second gate layer is formed at block 532. In one suitable example, TiN is formed by depositing TiN. The second dielectric layer and the second gate layer are patterned to form second capacitor/gate structures. A wet etch and a dry etch may follow the patterning. Silicide regions may also be formed on the second gate layer.

Subsequently, interlayer dielectric layers or other insulative layers are formed and contacts are selectively formed at block 534. Contacts are formed to the first gate layer or second gate layer depending upon desired operation of associated transistors. Generally, if high speed, low Vg operation is desired, a contact is formed to the first gate layer. If high Vg operation, which results in slower operation, is desired, a contact is formed to the second gate layer. Alternately, contacts can be formed to both the first and second gate layers. Then, a selection mechanism such as logic and/or fuses is employed to select which gate is employed.

Other layers, including protective layers and metallization layers, can then be performed to complete fabrication of the device.

It is appreciated that variations of the method 500 that form a plurality of capacitors connected in series are contemplated and in accordance with the present invention. For example, additional dielectric layers and conductive gate layers can be formed on the second gate layer to provide additional Vg max options. Additionally, only a single gate layer can be fabricated to form the drain extended transistor device depicting in FIGS. 2A and 2B.

FIGS. 6A to 6G depict various stages of fabrication for a drain extended n-type transistor 600 formed in accordance with the method 500 of FIG. 5. The stages are provided as exemplary structure to facilitate an understanding of the present invention. It is appreciated that the dimensions and/or sizes portrayed in these figures is also exemplary in nature and that actual devices formed in accordance with the present invention can have varied dimensions, sizes, and/or components.

Figure 6A:
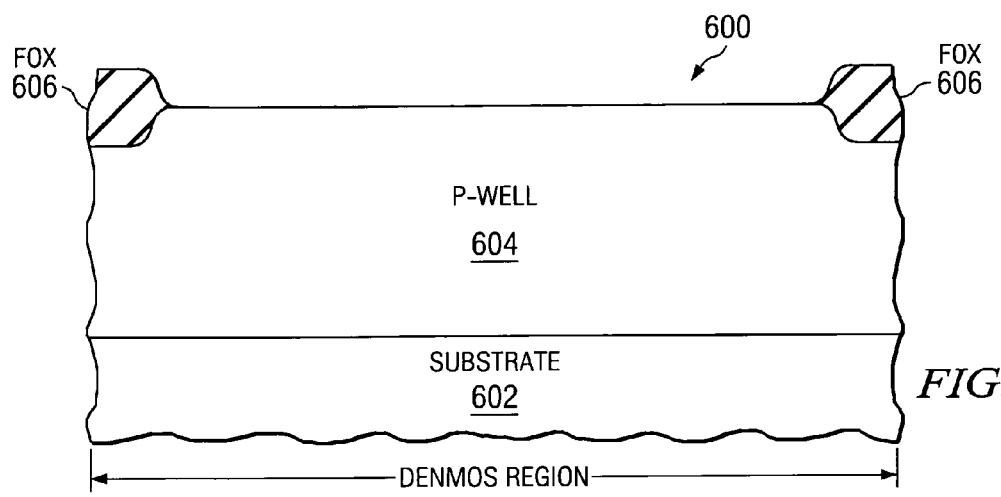
FIG. 6A is a cross sectional view of a drain extended n-type transistor device at a stage of fabrication in accordance with an aspect of the present invention.

FIG. 6A is a cross sectional view of a drain extended n-type transistor device 600 at a stage of fabrication in accordance with an aspect of the present invention. A substrate 602 is provided and a p-well region 604 is formed therein. Isolation structures 606 are formed that isolate the transistor device from other devices on an integrated circuit. The isolation structures can be LOCOS structures, STI structures, or another suitable isolation scheme. Implanting n-type and p-type dopant species into the substrate forms the n-well and p-well regions, respectively. Other types of implants including, but not limited to, n-type and p-type threshold voltage implants for setting the transistor threshold voltages, n-type and p-type punch through implants for reducing transistor off current, n-type and p-type channel stop implants for reducing isolation leakage, and n-type and p-type pocket implants for reducing threshold voltage roll-off.

Figure 6B:
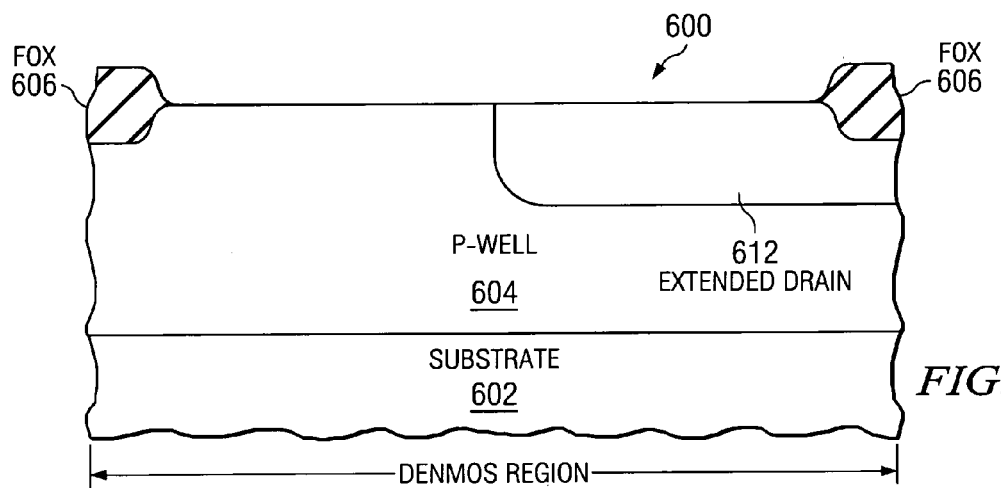
FIG. 6B is another cross sectional view of a drain extended n-type transistor device at a stage of fabrication wherein a drain extension region is formed in accordance with an aspect of the present invention.

FIG. 6B is another cross sectional view of a drain extended n-type transistor device 600 at a stage of fabrication wherein a drain extension region is formed in accordance with an aspect of the present invention. Here, a drain extension region 612 is formed within the p-well region 604 by implanting an n-type dopant with a relatively low dopant concentration. The dopant concentration is selected such that it will deplete when the drain voltage increases.

Figure 6C:
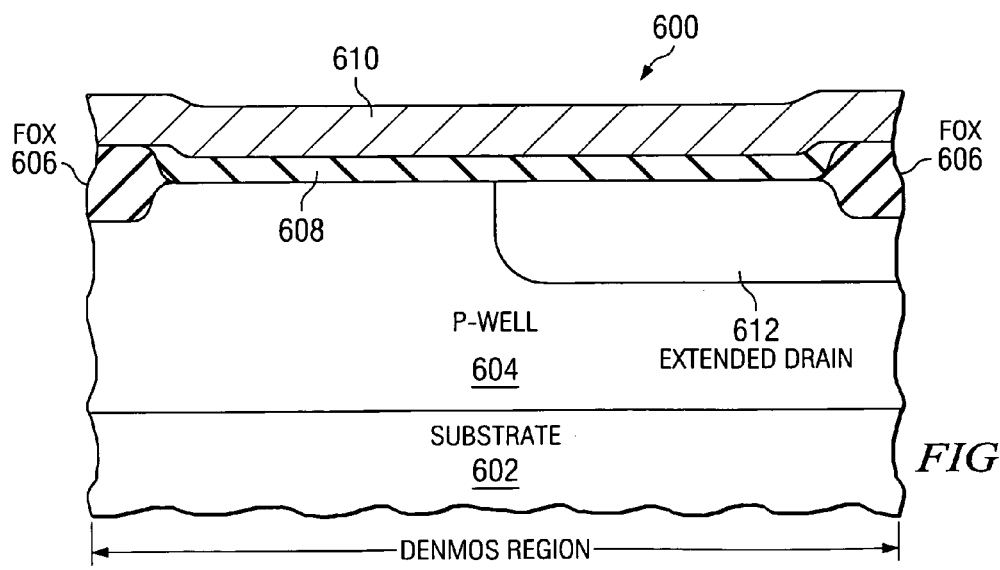
FIG. 6C is a cross sectional view of a drain extended n-type transistor device at a stage of fabrication in accordance with an aspect of the present invention.

FIG. 6C is a cross sectional view of a drain extended n-type transistor device 600 at a stage of fabrication in accordance with an aspect of the present invention. A first dielectric layer 608 is formed over the device and a first gate layer 610 is formed on the first dielectric layer 608. The first gate dielectric layer 608 is comprised of a dielectric material, such as, oxide, thermally grown oxide, a nitride, an oxynitride, and the like. Further, the first gate dielectric layer 608 is formed with a suitable thickness (e.g., 75 Angstroms). The first gate layer 610 is formed on the first gate dielectric layer 608 by depositing or forming a layer of conductive material. Some suitable conductive materials include, but are not limited to, polycrystalline silicon ("poly" or "polysilicon"), epitaxial silicon, and the like.

Figure 6D:
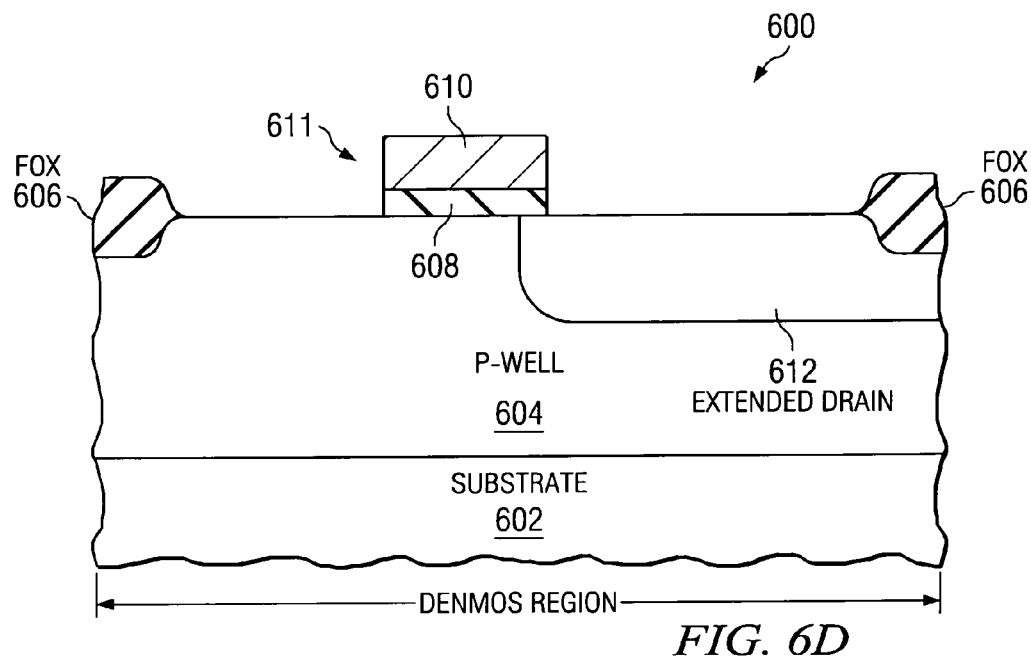
FIG. 6D is a cross section view of a drain extended n-type transistor device at a stage of fabrication wherein a gate structure is formed in accordance with an aspect of the present invention.

FIG. 6D is a cross section view of a drain extended n-type transistor device 600 at a stage of fabrication wherein a gate structure is formed in accordance with an aspect of the present invention. The first dielectric layer 608 and the first gate layer 610 are patterned to form a gate/capacitor structure 611 from remaining portions of the first dielectric layer 608 and the first gate layer 610. The gate/capacitor structure 611 is generally positioned so as to overly both the well region and later formed lightly doped drain extension region.

Figure 6E:
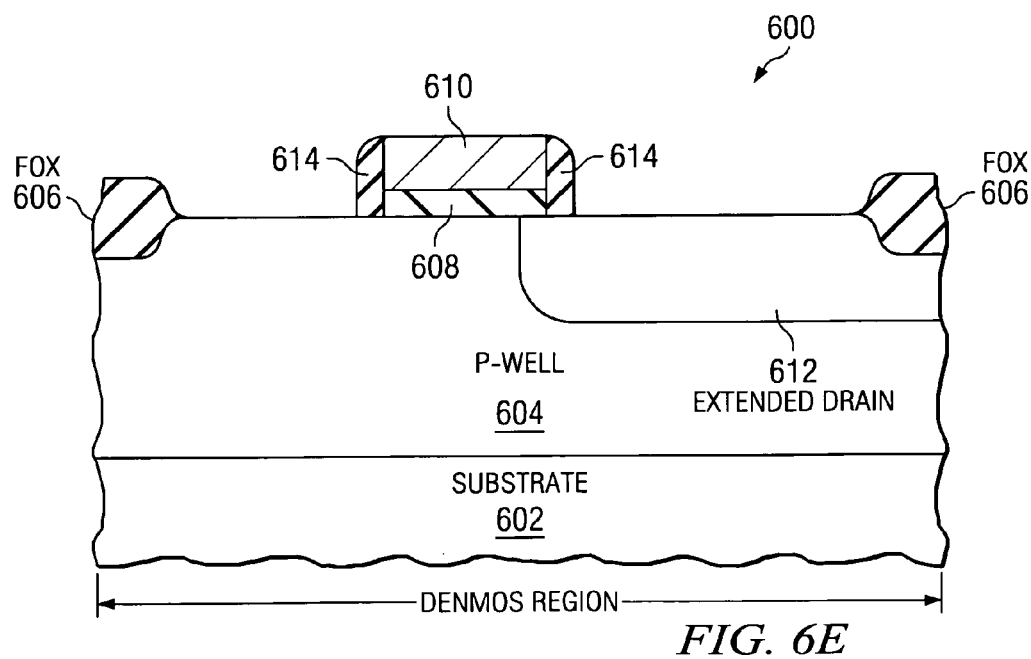
FIG. 6E is yet another cross sectional view of a drain extended n-type transistor device at a stage of fabrication wherein sidewall spacers are formed in accordance with an aspect of the present invention.

FIG. 6E is yet another cross sectional view of a drain extended n-type transistor device 600 at a stage of fabrication wherein sidewall spacers are formed in accordance with an aspect of the present invention. Sidewall spacer material, including silicon dioxide, silicon nitride, and the like, is blanket deposited and then etched anisotropically to form sidewall spacers 614.

Figure 6F:
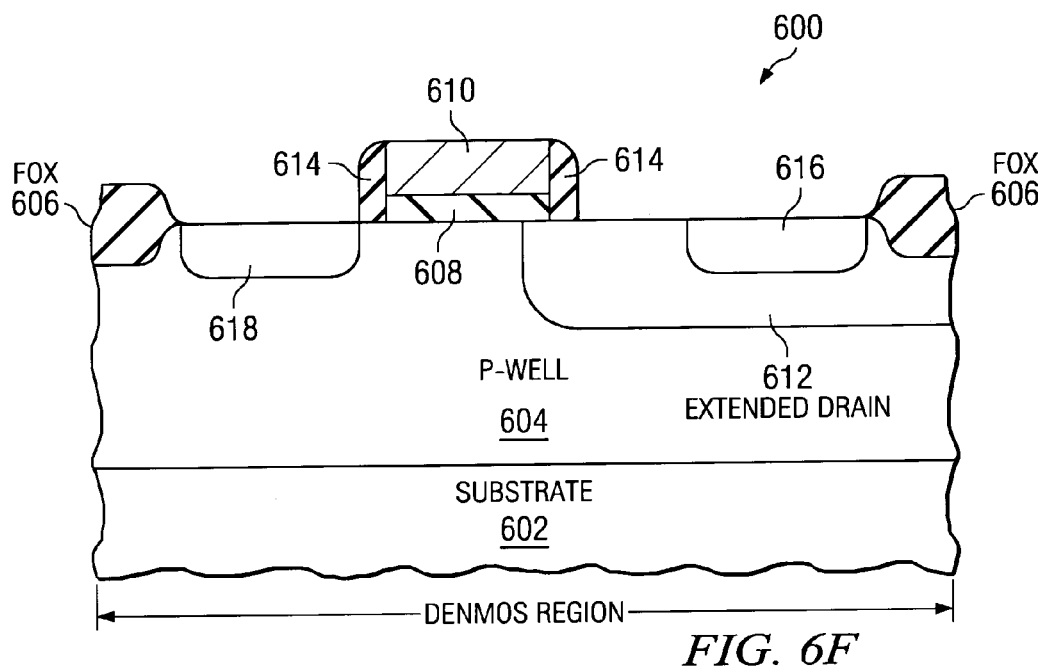
FIG. 6F is another cross sectional view of a drain extended n-type transistor device at a stage of fabrication wherein source/drain regions are formed in accordance with an aspect of the present invention.

FIG. 6F is another cross sectional view of a drain extended n-type transistor device 600 at a stage of fabrication wherein source/drain regions are formed in accordance with an aspect of the present invention. N-type dopants, such as phosphorous or arsenic, are implanted using a mask and the gate structures as alignment structures in order to form a drain region 616 and a source region 618. The drain region 618 formed is more n-type than the surrounding lightly doped drain extension region 612. A thermal process or anneal is typically then performed to activate the implanted dopants within the source/drain regions 616 and 618. Silicide regions (not shown) may also be formed on the first gate layer 610 after this stage.

Figure 6G:
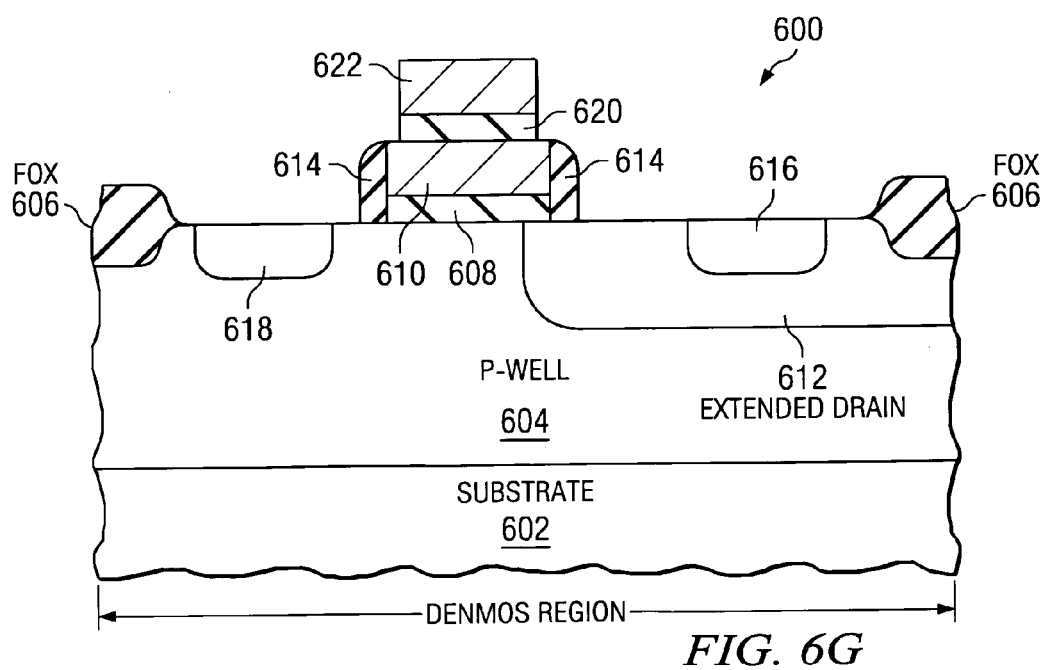
FIG. 6G is yet another cross sectional view of a drain extended n-type transistor device at a stage of fabrication wherein a second dielectric layer and a second gate layer are formed in accordance with an aspect of the present invention.

FIG. 6G is yet another cross sectional view of a drain extended n-type transistor device 600 at a stage of fabrication wherein a second dielectric layer 620 and a second gate layer 622 are formed in accordance with an aspect of the present invention. A suitable process for forming the second dielectric layer is to employ tetraethoxysilane (TEOS), a precursor for SiO2 formation by chemical vapor deposition until a suitable thickness is obtained. The thickness of this dielectric layer 620 can vary according to desired Vg max (e.g., about 70 Angstroms to about 500 Angstroms). The second gate layer 622 is formed on the first dielectric layer 620 by depositing a suitable conductive material, such as TiN. Subsequently, the second gate layer 622 and the second dielectric layer 620 are patterned thereby defining a second capacitor that employs the first gate layer 610 as a bottom plate, the second dielectric layer 620 as a dielectric, and the second gate layer 622 as a top plate.

Interlayer dielectric layers or other insulative layers and contacts can then be formed. Contacts are formed to the first gate layer or second gate layer depending upon desired operation of associated transistors, as stated supra. Generally, if high speed, low Vg operation is desired, a contact is formed to the first gate layer. If high Vg operation, which results in slower operation, is desired, a contact is formed to the second gate layer. Alternately, contacts can be formed to both the first and second gate layers. Then, a selection mechanism such as logic and/or fuses is employed to select which gate is employed.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A multi-capacitor drain extended transistor device comprising:
 a drain region of a first conductivity type formed within a first lightly doped region of the first conductivity type;
 a gate region of the first conductivity type formed within a second lightly doped region of the first conductivity type;
 a source region of the first conductivity type formed within a semiconductor substrate of a second conductivity type defining a channel region between the source region and the drain region; and
 a gate structure comprised of a dielectric layer and a gate layer overlying at least a portion of the channel region and at least a portion of the gate region.

2. The device of claim 1, further comprising a first capacitor contact connected to the gate layer that provides a first Vg max.

3. The device of claim 2, further comprising a second capacitor contact connected to the gate region the provides a second Vg max that is greater than the first Vg max.

4. The device of claim 1, wherein the first conductivity type is n-type, and wherein the second conductivity type is p-type.

5. The device of claim 1, wherein the first conductivity type is p-type, and wherein the second conductivity type is n-type.

* * * * *